United States Patent [19]

Nakamura et al.

[11] 3,731,216

[45] May 1, 1973

[54] AUTOMATIC GAIN CONTROL CIRCUIT

[75] Inventors: Hideo Nakamura, Chofu-shi, Kitatama-gun, Tokyo; Kokichi Morii, Kita-ku, Tokyo, both of Japan

[73] Assignee: Sony Corporation, Tokyo, Japan

[22] Filed: June 23, 1971

[21] Appl. No.: 156,015

Related U.S. Application Data

[63] Continuation of Ser. No. 828,597, May 28, 1969, abandoned.

[30] Foreign Application Priority Data

May 31, 1968 Japan ................................43/37154

[52] U.S. Cl. ..........................330/29, 330/20, 330/35

[51] Int. Cl. ................................................H03g 3/30

[58] Field of Search....................330/20, 29, 35, 133; 325/319

[56] References Cited

UNITED STATES PATENTS

| | | | |
|---|---|---|---|
| 3,440,543 | 4/1969 | Polzl | 325/319 X |
| 3,388,338 | 6/1968 | Austin | 330/29 |
| 3,404,347 | 10/1968 | Kaplin | 330/35 X |

*Primary Examiner*—Roy Lake
*Assistant Examiner*—James B. Mullins
*Attorney*—Lewis H. Eslinger et al.

[57] ABSTRACT

An automatic gain control amplifier has at least two amplifier stages forming a transmission line for an input signal with one of the stages constituted by a transistor and the other stage constituted by a field effect transistor. A reverse automatic gain control signal for the field effect transistor is derived from the output of the transmission line and a forward automatic gain control signal responsive to a current flowing through the field effect transistor is applied to the transistor, and improper bias of the transistor is suppressed so as to maintain the latter at its proper quiescent DC bias.

10 Claims, 2 Drawing Figures

Figure 1:
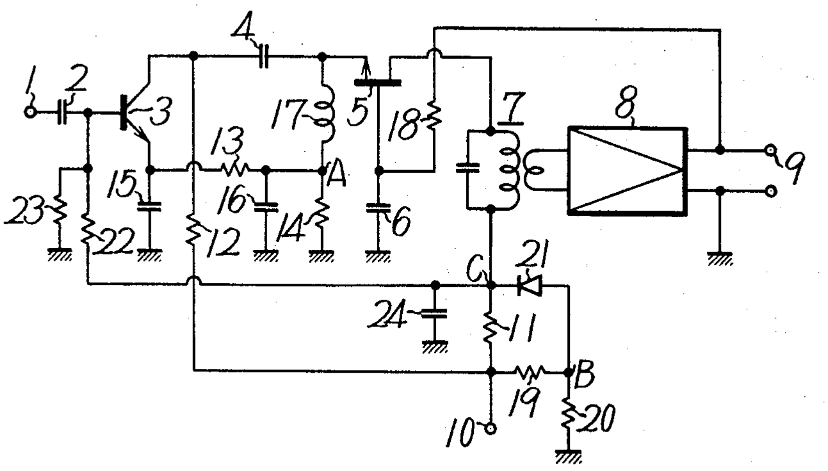

INVENTORS
HIDEO NAKAMURA
KOKICHI MORII

BY

AUTOMATIC GAIN CONTROL CIRCUIT

This application is a continuation of the pending application Ser. No. 828,597, filed May 28, 1969, and now abandoned.

This invention relates generally to the automatic control of the gain of amplifiers, and more particularly is directed to an improved automatic gain control (AGC) circuit which is adapted to achieve an AGC action by the combined use of an amplifier having a field effect transistor and an amplifier having a transistor.

As is well known, an AGC action is classified as either a forward AGC action or a reverse AGC action. The forward AGC action occurs when the gain of the amplifier decreases with an increase in a current supplied to the transistor, and the reverse AGC action occurs when the gain of the amplifier increases with an increase in current to the transistor.

The use of reverse AGC action with a conventional transistor amplifier leads to deterioration of its characteristics when a strong input signal is applied thereto. With the use of the forward AGC action, excellent characteristics can be obtained, even in the case of a strong input signal, but this necessitates the provision of some means for amplifying an AGC signal so as to raise its level.

It has been proposed, for example, in U.S. Pat. No. 3,310,752, to provide a two stage amplifier in which each stage is constituted by a transistor, with the transistor of the first stage being subject to forward AGC action and the transistor of the second stage being subject to reverse AGC action. However, the use of reverse AGC action with respect to the common transistor of the second amplifier stage leads to deterioration of the characteristics of that stage when a strong input signal is applied thereto, as mentioned above.

It has also been proposed, for example, in U.S. Pat. No. 3,388,338, to provide a gain controlled amplifier in which an insulated gate field effect transistor constitutes the sole active element, that is, the only element for amplifying the input to the amplifier. In such amplifier, an AGC circuit, including a common transistor and an AGC amplifier, is provided to increase forward bias between the input electrodes of the field effect transistor as a function of the magnitude of an applied input signal to be amplified over a first range of gain control voltages, and thereafter, over a second range of gain control voltages, to maintain the mentioned forward bias substantially constant while decreasing the operating potential to the output electrode of the field effect transistor as a function of further increases in the applied signal level. The disadvantage of the foregoing AGC arrangement is that only the single field effect transistor is available for amplifying the applied input signal, and the mentioned AGC amplifier and associated common transistor, while increasing the complexity of the circuit, do not contribute to the amplification of the applied input signal.

Accordingly, it is an object of this invention to provide an AGC amplifier that avoids the above disadvantages of the prior art.

More specifically, it is an object of this invention to provide a multi-stage AGC amplifier in which the AGC circuit is stable in operation, excellent in the signal-to-noise ratio and low in distortion factor.

Another object is to provide a stable AGC circuit which exhibits a reduced distortion factor even when a large input is applied thereto.

In accordance with an aspect of this invention, an AGC amplifier comprises at least two amplifier stages connected to each other to constitute a transmission line for an input signal, one of said amplifier stages being constituted by a transistor and the other of the amplifier stages being constituted by a field effect transistor. An automatic gain control signal which varies in accordance with the level of the input signal and is derived from the output of the transmission line is applied to the field effect transistor and decreases a current through the latter for decreasing the gain thereof in response to an increase in the level of the input signal, and means are provided responsive to such current through the field effect transistor for varying a bias voltage of the transistor in the direction for increasing a current flowing therethrough, and thereby reducing the gain of the transistor, in accordance with reductions of the mentioned current through the field effect transistor. Further, in accordance with the invention, improper bias of the transistor is suppressed by means establishing a reference potential and which is interconnected with the means by which the bias voltage is varied. Preferably, improper bias of the transistor is suppressed by means of a resistive voltage divider and a Zener diode connected between the output of the voltage divider and the input of a bias circuit for the transistor, which bias circuit may include a resistor connecting the base of the transistor to ground and a resistor connecting such base to the Zener diode.

Figure 2:
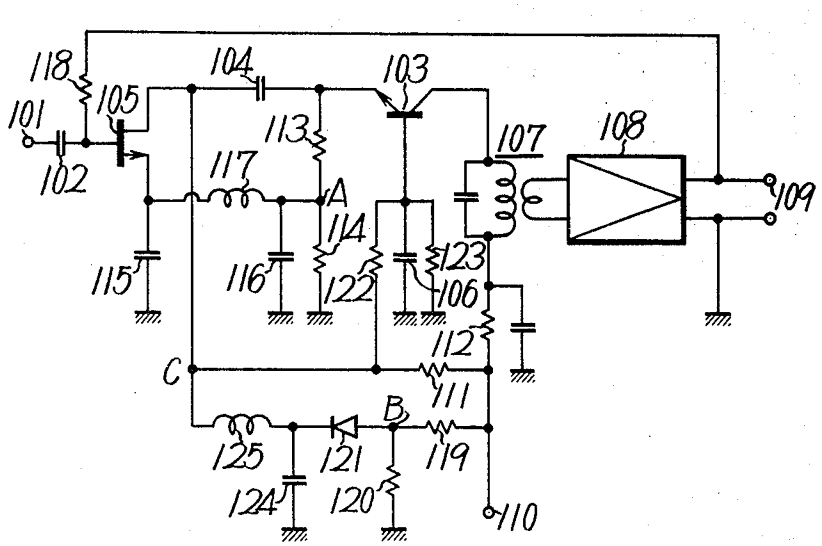

The above, and other objects, features and advantages of this invention, will be apparent in the following detailed description of illustrative embodiments which is to be read in connection with the accompanying drawing, wherein:

FIG. 1 is a circuit connection diagram showing one embodiment of an AGC amplifier according to this invention; and FIG. 2 is a circuit connection diagram illustrating another embodiment of this invention.

Referring to the drawing in detail, and initially to FIG. 1 thereof, it will be seen that the AGC amplifier there shown has a signal input terminal 1 which is connected through a capacitor 2 to the base of a transistor 3 making up a first or transistor amplifier stage. The collector of transistor 3 is connected through a capacitor 4 to the source of a field effect transistor 5 making up a second or field effect transistor amplifier stage (hereinafter referred to as an FET amplifier). The gate of field effect transistor 5 is grounded through a capacitor 6, and the drain of field effect transistor 5 is connected to an LC parallel resonance circuit 7 which resonates at an intermediate frequency. An intermediate-frequency amplifier circuit 8 is supplied with an intermediate-frequency signal derived from parallel resonance circuit 7 by transformer coupling. The illustrated circuit further has an output terminal 9 and an operating voltage terminal 10 which is connected to parallel resonance circuit 7 through a resistor 11 and to the collector of transistor 3 through a resistor 12. Further, the emitter of transistor 3 is grounded through a series circuit of resistors 13 and 14 and through a capacitor 15 in parallel with resistors 13 and 14. The connection point between the resistors 13 and 14 is grounded through a capacitor 16.

With such an arrangement, a signal fed to input terminal 1 is amplified by the transistor amplifier and the FET amplifier successively and is then applied to the intermediate-frequency amplifier circuit 8. The intermediate-frequency amplifier circuit 8 has incorporated therein a conventional detector circuit (not shown) and, accordingly, there is derived from the output terminal 9 an output resulting from detection of the intermediate-frequency signal.

In the AGC amplifier according to the present invention, the transistor amplifier stage and the FET amplifier stage are incorporated in a signal transmission line; an AGC signal is fed to the FET amplifier to decrease the current flowing to field effect transistor 5, and in so doing, to decrease the gain of the FET amplifier so as to exert a reverse AGC action on the latter; and a bias voltage applied to transistor 3 of the transistor amplifier is caused to vary with the changes in the current to the FET amplifier to increase the current flowing to the transistor 3 for decreasing the gain of the transistor amplifier with a forward AGC action, thereby automatically controlling the gain of the signal transmitted through the signal transmission line.

In order to achieve the above operation, a coil 17 is connected between the source of field effect transistor 5 and the connection point A between resistors 13 and 14 and a portion of the detected output of the intermediate-frequency signal from intermediate-frequency amplifier circuit 8 is applied, as an AGC signal, to the gate of field effect transistor 5 through a resistor 18. Further, a series circuit of resistors 19 and 20 is connected between operating voltage terminal 10 and ground, and a constant-voltage element, for example, a Zener diode 21, is connected between the connection point B between resistors 19 and 20 and the connecting point C between resistor 11 and parallel resonance circuit 7. Finally, between connection point C and ground there are connected a series circuit of resistors 22 and 23 and, in parallel therewith, a capacitor 24, and the connection point between resistors 22 and 23 is connected to the base of transistor 3.

With an arrangement as described above, when no signal input is applied to input terminal 1, no detected output is produced at terminal 9, and hence the gate of field effect transistor 5 is at zero potential. At this time, a drain current $I_{DS}$ of field effect transistor 5 is at a maximum and the gain of the FET amplifier is at its maximum. At the same time, the collector, base and emitter of transistor 3 are supplied with predetermined potentials, so that predetermined currents flow to them to provide the transistor amplifier with its maximum gain. Thus, it may be assumed that transistor 3 and field effect transistor 5 operate to provide maximum gain at all times under the above conditions of no input signal.

When an input signal is fed to input terminal 1, a negative detected output is derived from output terminal 9. Since a portion of the detected output is applied as an AGC signal to the gate of field effect transistor 5, the gate of the field effect transistor 5 is biased at a negative potential corresponding to the value of the input signal, with the result that the drain current $I_{DS}$ of the field effect transistor 5 decreases to decrease the gain of the latter. This causes a decrease in a DC potential at the connection point A between coil 17 and resistor 14. Simultaneously, the potential at the connection point C between parallel resonance circuit 7 and resistor 11 becomes higher than a predetermined DC potential established by Zener diode 21 and the base potential of the transistor 3 increases. As a result of this, the base current of the transistor 3 increases and, at the same time, its collector current also increases. This leads to a great voltage drop across the resistor 12 to reduce the collector potential of the transistor 3, which results in a decrease in the gain of transistor 3 from the maximum gain when no signal input was applied. Thus, forward AGC action is achieved with respect to transistor 3, whereas, the field effect transistor 5 decreases its gain with a decrease in its drain current and accordingly is subject to a reverse AGC action. Since the decrease in the gains of both amplifier stages is effected in response to an increase in the level of the input signal, the desired uniform output signal level can be attained.

With the described arrangement, the signal is amplified by the transistor 3 and is then further amplified by the field effect transistor 5, so that the level of the signal is greatly amplified. Since the AGC signal is derived from a part of the greatly amplified output signal, this provides an AGC signal of a level high enough to achieve the forward AGC action on transistor 3 without a separate amplifier therefor.

With the forward AGC action by the transistor 3 it is possible to provide an AGC circuit which is stable in operation, excellent in signal-to-noise ratio and low in distortion factor even when the input signal is great. The field effect transistor exhibits excellent characteristics in the case of both the reverse and forward AGC actions. Consequently, the AGC circuit is extremely stable in operation, excellent in signal-to-noise ratio and low in distortion factor.

The Zener diode 21 is provided for suppressing dispersion in the characteristics of field effect transistor 5. The field effect transistor is great in its drain current $I_{DS}$ at zero bias voltage and this introduces the possibility that when the bias voltage is zero, that is, when no input signal is applied, the potential at the connection point C between parallel resonance circuit 7 and resistor 11 may cause an unnecessary increase in the potential at the connection point A between coil 17 and resistor 14. Such unnecessary rise in the potential at connection point A is likely to cut off the transistor 3. However, by reason of the Zener diode 21, the potential at connection point C is held at a constant value to prevent cutting-off of transistor 3 and to stabilize it irrespective of changes in the power source voltage applied to terminal 10. Accordingly, the voltage applied to terminal 10 need not be constant.

Although the FET amplifier constitutes the stage subsequent to the transistor amplifier stage in the above described embodiment, the FET amplifier may be followed by the transistor amplifier, for example, as illustrated in FIG. 2.

In the AGC amplifier of FIG. 2, a signal input terminal 101 is connected through a capacitor 102 to the gate of a field effect transistor 105. The source of field effect transistor 105 is grounded through a capacitor 115, and its drain is connected through a capacitor 104 to emitter of a transistor 103 which constitutes a base-grounded type amplifier stage. The base of transistor 103 is grounded through a parallel circuit of a capacitor 106 and a resistor 123 and its collector is connected to an LC parallel resonance circuit 107 which resonates at an intermediate frequency. Reference numeral 109 indicates an output terminal from which one portion of an intermediate-frequency detected output of an intermediate frequency amplifier 108 is applied as an AGC voltage to the gate of field effect transistor 105 through a resistor 118. Reference numeral 110 designates a power supply terminal which is connected to parallel resonance circuit 107 through a resistor 112 and to the drain of field effect transistor 105 through a resistor 111 and further to the base of the transistor 103 through resistor 111 and a resistor 122. The emitter of transistor 103 is grounded through series connected resistors 113 and 114 and the connection point A therebetween is grounded through a capacitor 116.

In the present embodiment, a coil 117 is connected between the source of field effect transistor 105 and connection point A, and by which the emitter of transistor 103 is supplied with a bias voltage corresponding to the degree of amplification of a current of the field effect transistor 105 achieved in response to the AGC signal. Further, a connection point B between series connected resistors 119 and 120, which are connected between power supply terminal 110 and ground, is grounded through a Zener diode 121 and a capacitor 124 and is further connected to the drain of field effect transistor 105 through a coil 125.

Upon the application of an input signal to input terminal 101, a negative detected output is produced at output terminal 109 to bias the gate of field effect transistor 105 at a negative potential. As a result of this, the drain current $I_{DS}$ of field effect transistor 105 decreases to lower the DC potential at connection point A, causing a decrease in the emitter potential of the transistor 103. Further, the potential at connection point C rises and, accordingly, the base potential of transistor 103 is increased. Consequently, the current flowing through transistor 103 increases to decrease the gain of the signal passing through the transistor 103, thus achieving the forward AGC action. Since the current flowing through field effect transistor 105 decreases, its gain also decreases thereby to carry out the reverse AGC action.

The Zener diode 121 is provided for selective biasing when the potential at connection point C becomes lower than that at connection point B. Therefore, Zener diode 121 performs substantially the same functions as the Zener diode 21 of the first described embodiment.

In the illustrated embodiments, the AGC amplifier is shown to have only two stages. However, if desired, one or more additional amplifier stages can be interposed between the transistor amplifier and the FET amplifier, and each such additional stage may be constituted by an NPN- or PNP- type transistor or by a field effect transistor. Further, in the illustrated embodiments, the AGC amplifiers according to the invention have been applied to the mixer circuits of radio receivers, but it is apparent that other applications thereof are possible.

Although illustrative embodiments of the invention have been described in detail herein with reference to the accompanying drawing, it is to be understood that the invention is not limited to those precise embodiments, and that various changes and modifications may be effected therein by one skilled in the art without departing from the scope or spirit of the invention.

What is claimed is:

1. An automatic gain control amplifier comprising at least two amplifier stages connected to each other to constitute a transmission line for an input signal, one of said amplifier stages being constituted by a transistor and the other of said amplifier stages being constituted by a field effect transistor, means for supplying to said field effect transistor an automatic gain control signal which varies in accordance with the level of said input signal and is derived from the output of said transmission line and which decreases a current through said field effect transistor for decreasing the gain of the latter in response to an increase in the level of said input signal thereby to exert a reverse AGC action on said field effect transistor, means responsive to said current through the field effect transistor for varying a bias voltage of said transistor of said one amplifier stage in the direction for increasing a current flowing through said transistor, and thereby reducing the gain of the latter, in accordance with reductions of said current through the field effect transistor for exerting a forward AGC action on said transistor of said one amplifier stage, and means for automatically suppressing improper bias of the transistor of said one amplifier stage and including means establishing a reference potential interconnected with said means responsive to the current through the field effect transistor for maintaining said transistor at least at its proper quiescent DC bias.

2. An automatic gain control amplifier according to claim 1, wherein said means for suppressing improper bias includes a resistive voltage divider, and a Zener diode connected between the divider output and a bias circuit input of said transistor of said one amplifier stage.

3. An automatic gain control circuit according to claim 2, wherein said transistor of said one amplifier stage has a bias circuit comprising a first resistor connected between the base of said transistor and ground and a second resistor connected between said base and said Zener diode.

4. An automatic gain control amplifier according to claim 2, wherein a single power supply terminal is connected in series with the drain-source terminals of the field effect transistor and a current limiting resistor, and said Zener diode and one resistor of said resistive voltage divider shunt said current limiting resistor.

5. An automatic gain control amplifier according to claim 2, wherein said means for suppressing improper bias includes means constituting a capacitive connection to ground at the output of the Zener diode.

6. An automatic gain control amplifier according to claim 1, in which said one amplifier stage precedes said other amplifier stage in said transmission line.

7. An automatic gain control amplifier according to claim 6, in which said transistor has its emitter capacitively connected to ground and said field effect transistor has its gate capacitively connected to ground.

8. An automatic gain control amplifier according to claim 1, in which said one amplifier stage follows said other amplifier stage in said transmission line.

9. An automatic gain control amplifier according to claim 8, in which said field effect transistor has its source capacitively connected to ground and said transistor has its base capacitively connected to ground.

10. An automatic gain control amplifier according to claim 1, in which said automatic gain control signal decreases negatively with increasing levels of said input signal and is applied as a negative bias potential to the gate of said field effect transistor so that the drain current of the latter decreases to decrease said gain of the field effect transistor in accordance with an increasing level of said input signal, and said decreasing drain current of the field effect transistor causes an increase in the base potential of said transistor for increasing said current flowing through the transistor.

* * * * *